United States Patent
Hutton et al.

(10) Patent No.: US 9,178,513 B1
(45) Date of Patent: Nov. 3, 2015

(54) MEMORY BLOCKS WITH SHARED ADDRESS BUS CIRCUITRY

(71) Applicant: Altera Corporation, San Jose, CA (US)

(72) Inventors: Michael D. Hutton, Mountain View, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 7 days.

(21) Appl. No.: 14/135,466

(22) Filed: Dec. 19, 2013

(51) Int. Cl.
*H03K 19/177* (2006.01)
*H03K 19/00* (2006.01)

(52) U.S. Cl.
CPC ...................................... *H03K 19/00* (2013.01)

(58) Field of Classification Search
CPC .............. H03K 19/1773; H03K 19/17704
USPC ............... 326/37–41, 47, 56–58; 711/211
See application file for complete search history.

(56) References Cited

U.S. PATENT DOCUMENTS

| | | | |
|---|---|---|---|
| 6,141,741 A | 10/2000 | Priem et al. | |
| 8,295,107 B2 | 10/2012 | Ware et al. | |
| 8,386,739 B2 | 2/2013 | Franceschini et al. | |
| 8,412,912 B2* | 4/2013 | Xu et al. | 711/211 |
| 2008/0024165 A1* | 1/2008 | Madurawe et al. | 326/41 |
| 2010/0235590 A1* | 9/2010 | Tam | 711/149 |
| 2013/0124820 A1* | 5/2013 | Craske | 711/202 |

* cited by examiner

*Primary Examiner* — Jason M Crawford
(74) *Attorney, Agent, or Firm* — Jason Tsai

(57) ABSTRACT

An integrated circuit may have configurable storage blocks. Multiple configurable storage blocks may share one or more internal address busses with selected configurable storage blocks having access a given address bus. An address bus may be unidirectional or bidirectional and may convey the same address signal from one configurable address block to another or to several other configurable storage blocks. Tri-state buffers or multiplexers may selectively couple or decouple the address bus between configurable storage blocks. Redundant address bus paths may bypass configurable address blocks in neighboring rows or columns allowing for disabling the respective row or column. The address bus may further have pipeline registers to allow for pipelined access to configurable storage blocks.

25 Claims, 12 Drawing Sheets

MEMORY BLOCKS WITH SHARED ADDRESS BUS CIRCUITRY

BACKGROUND

This invention relates to integrated circuits and, more particularly, to configurable storage blocks in an integrated circuits.

Considering a programmable logic device (PLD) as one example of an integrated circuit, as applications for which PLDs are used increase in complexity, it has become more common to design PLDs to include specialized blocks such as configurable storage blocks in addition to blocks of generic programmable logic.

Configurable storage blocks are often arranged in arrays of memory elements. In a typical array, data lines are used to write data into and read data from the configurable storage blocks. Address lines may be used to select which of the memory elements are being accessed. A configurable storage block is typically configurable to implement a memory of a given depth and width, whereby the maximum depth is based on the number of address lanes and the maximum width on the number of data lanes.

A situation may arise where a user wants to implement a given memory with a width that exceeds the maximum width of a single configurable storage block. In this situation, multiple configurable storage blocks may be used together to implement the given memory. In such a configuration, each configurable storage block stores a portion of the given memory at a given address in the respective configurable storage block.

SUMMARY

In accordance with some embodiments described herein, an integrated circuit may have a first and second storage circuit. The first storage circuit may have first and second address ports, receive an address signal at the first address port, and route the received address signal to the second address port. The second storage circuit may have a third address port coupled to the second address port. The second storage circuit may receive the address signal from the second address port at the third address port, and use the received address signal to identify a memory segment of the second storage circuit.

The first storage circuit may further have a tri-state buffer coupled between the first and second address ports. The tri-state buffer may selectively couple the first address port to the second address port or decouple the first address port from the second address port. The second storage circuit may further have a fourth address port that receives an additional address signal and a multiplexer that selects between the address signal from the third address port and the additional address signal from the fourth address port.

It is appreciated that the present invention can be implemented in numerous ways, such as a process, an apparatus, a system, a device, or a method executed on a processing machine. Several inventive embodiments are described below.

In certain embodiments, the above-mentioned second storage circuit may further have a fifth address port and a tri-state buffer coupled between the third and fifth address ports. This tri-state buffer may selectively couple the third address port to the fifth address port or decouple the third address port from the fifth address port.

If desired, an additional tri-state buffer placed between the second address port and the third address port may selectively couple the second address port to the third address port or decouple the second address port from the third address port. Another additional tri-state buffer placed between the third address port and the second address port may selectively couple the third address port to the second address port or decouple the third address port from the second address port.

Further features of the invention, its nature and various advantages, will be more apparent from the accompanying drawings and the following detailed description of the preferred embodiments.

DETAILED DESCRIPTION

The present invention relates to integrated circuits and more specifically to configurable storage blocks in an integrated circuit.

Figure 1:
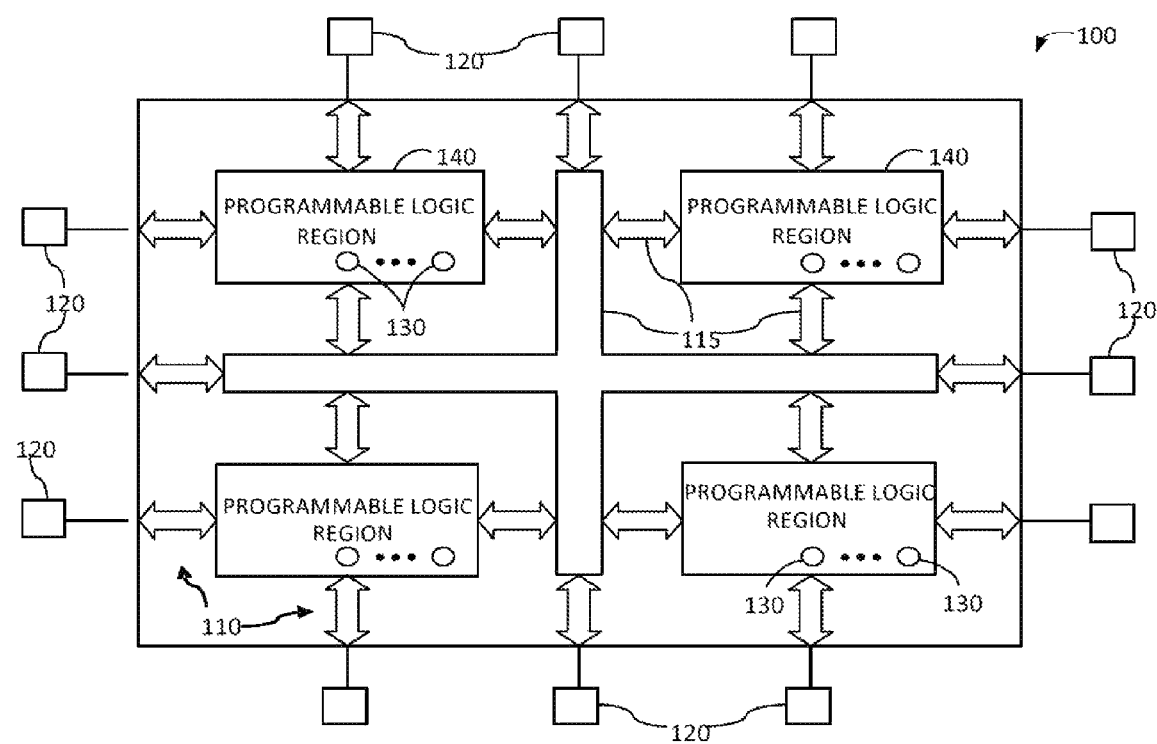
FIG. 1 is a diagram of an illustrative programmable integrated circuit with programmable logic regions in accordance with an embodiment.

An illustrative embodiment of an integrated circuit such as a programmable logic device (PLD) 100 in accordance with the present invention is shown in FIG. 1.

Programmable logic device 100 has input/output circuitry 110 for driving signals off of PLD 100 and for receiving signals from other devices via input/output pins 120. Interconnection resources 115 such as global and local vertical and horizontal conductive lines and buses may be used to route signals on PLD 100.

Input/output circuitry 110 include conventional input/output circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry. The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

Programmable logic device 100 contains programmable memory elements 130. Memory elements 130 can be loaded with configuration data (sometimes also referred to as programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM, or programmable memory elements.

The circuitry of programmable logic device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) containing multiple logic elements or multiple ALMs.

During device programming, configuration data is loaded into programmable logic device 100 that configures the programmable logic regions 140 so that their logic resources perform desired logic functions.

Configurable storage blocks in programmable logic region 140 are often arranged in arrays of memory elements. In a typical array, data lines are used to write data into and read data from the configurable storage blocks. Address lines may be used to select which of the memory elements are being accessed. A configurable storage block is typically configurable to implement a memory of a given depth and width, whereby the maximum depth is based on the number of address lanes and the maximum width on the number of data lanes.

A situation may arise where a user wants to implement a given memory with a width that exceeds the maximum width of a single configurable storage block. In this situation, multiple configurable storage blocks may be used together to implement the given memory. In such a configuration, each configurable storage block stores a portion of the given memory at a given address in the respective configurable storage block. In other words, accessing data at a given address requires routing the address signal to each of the configurable storage blocks leading potentially to an increase in routing congestion and timing closure problems.

Figure 2:
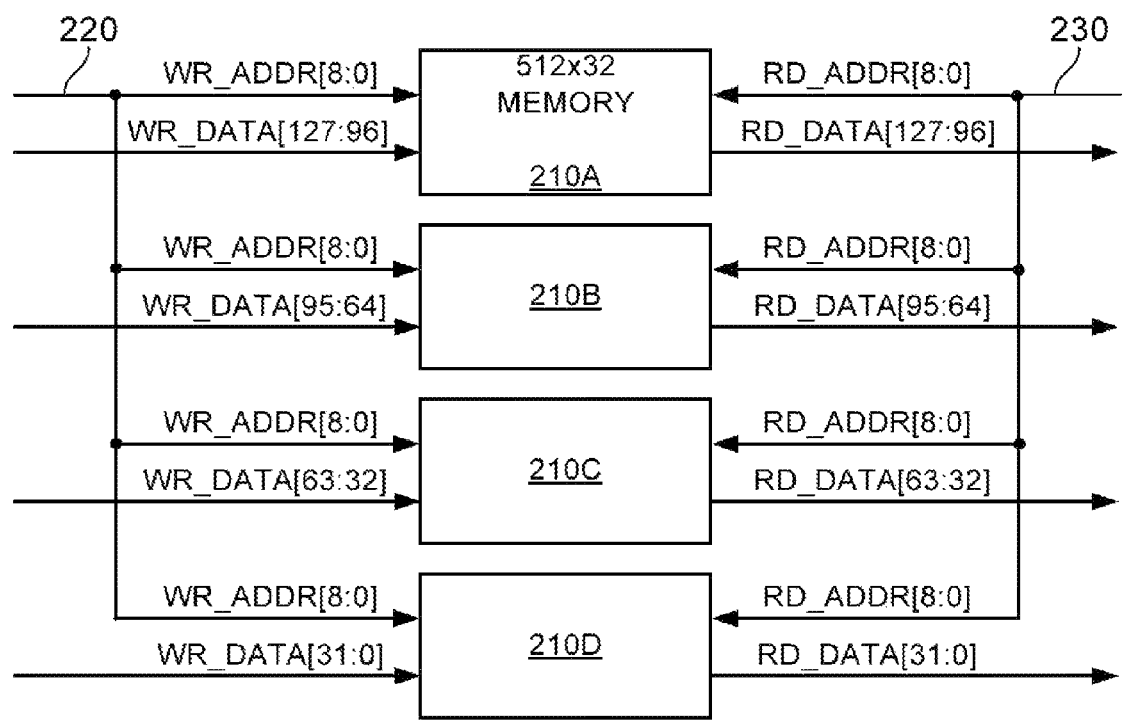
FIG. 2 is a diagram of an illustrative 512×128 memory implemented using four configurable storage blocks in 512× 32 mode in accordance with an embodiment.

As an example, consider the implementation of a 128 bit wide and 512 bit deep simple-dual port memory (512×128 SDP memory). A simple-dual port memory has one read port and one write port and can perform one read and one write operation at the same time. Consider further that the 512×128 SDP memory is implemented using four configurable storage blocks, which each use 32-bit data lanes. An embodiment of such an implementation is shown in FIG. 2.

Each configurable storage block 210A, 210B, 210C, and 210D may be configured in 512×32 simple-dual port mode (i.e., 512 bits deep and 32 bits wide with one read and one write port) and store a 32-bit slice of the 512×128 memory. For example, configurable storage block 210D may store the 32 bits [31:0], 210C may store bits [63:32], 210B may store bits [95:64], and 210A may store bits [127:96].

Each configurable storage block 210 may receive data that is to be stored in the configurable storage block during a write operation (e.g., WR_DATA) at one port. Data may also be retrieved from the configurable storage block during a read operation (e.g., RD_DATA) at a different port.

A 512-bit deep memory may be accessed using nine address bits. A simple-dual port memory may require two separate address lanes such as address lanes for performing a write operation and address lanes for performing a read operation. Address lanes for performing a write operation and a read operation are sometimes also referred to as a write address and a read address. In the example above, a 9-bit write address signal such as write address signal 220 must be routed to all write ports, and a 9-bit read address signal such as read address signal 230 must be routed to all read ports of configurable storage blocks 210A, 210B, 210C, and 210D, leading to an increase in routing congestion in the proximity of the configurable storage blocks and thus potentially to timing closure problems.

It may be desirable to distribute the address signal from one configurable storage block to another configurable storage block or to several other configurable storage blocks using an address bus internal to the configurable storage blocks. Such an internal address bus may alleviate the routing congestion problem and thus facilitate timing closure.

Figure 3:
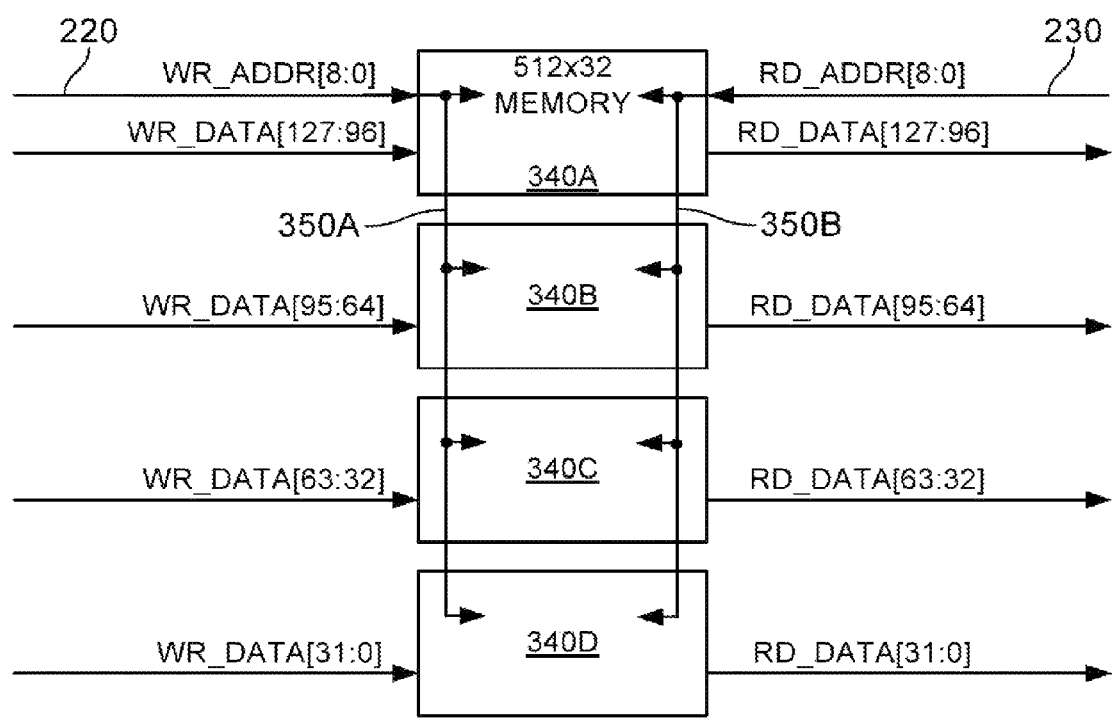
FIG. 3 is a diagram of an illustrative 512×128 memory implemented using four configurable storage blocks in 512× 32 mode coupled by an internal address bus in accordance with an embodiment.

FIG. 3 shows an illustrative diagram of a 512×128 simple-dual port memory implemented using four configurable storage blocks 340A, 340B, 340C, and 340D that are coupled by an internal address bus.

Each configurable storage block 340A, 340B, 340C, and 340D may be configured in 512×32 simple-dual port mode and store a 32-bit slice of the 512×128 memory. For example, configurable storage block 340D may store the 32 bits [31:0], 340C may store bits [63:32], 340B may store bits [95:64], and 340A may store bits [127:96]. Each configurable storage block 340 may write data to the configurable storage block at one port and read data from the configurable storage block operation at a different port.

A 9-bit write address signal such as write address signal 220 may be routed to the write port of configurable storage block 340A where the write address signal accesses the internal address bus 350A and propagates to configurable storage blocks 340B, 340C, and 340D. Similarly, and a 9-bit read address signal such as read address signal 230 may be routed to the read port of configurable storage blocks 340A where the read address signal accesses the internal address bus 350B and propagates to configurable storage blocks 340B, 340C, and 340D.

Propagating the address signal over internal address busses may alleviate the routing congestion, especially in the proximity of configurable storage blocks. In the example of FIG. 3, nine address lanes were saved on each write and read port of configurable storage blocks 340B, 340C, and 340D for a total of 54 routed wires. The reduction in routing stress frees up routing resources that other paths such as the data lanes may use, thus increasing the routing choices which potentially facilitates timing closure.

Figure 4:
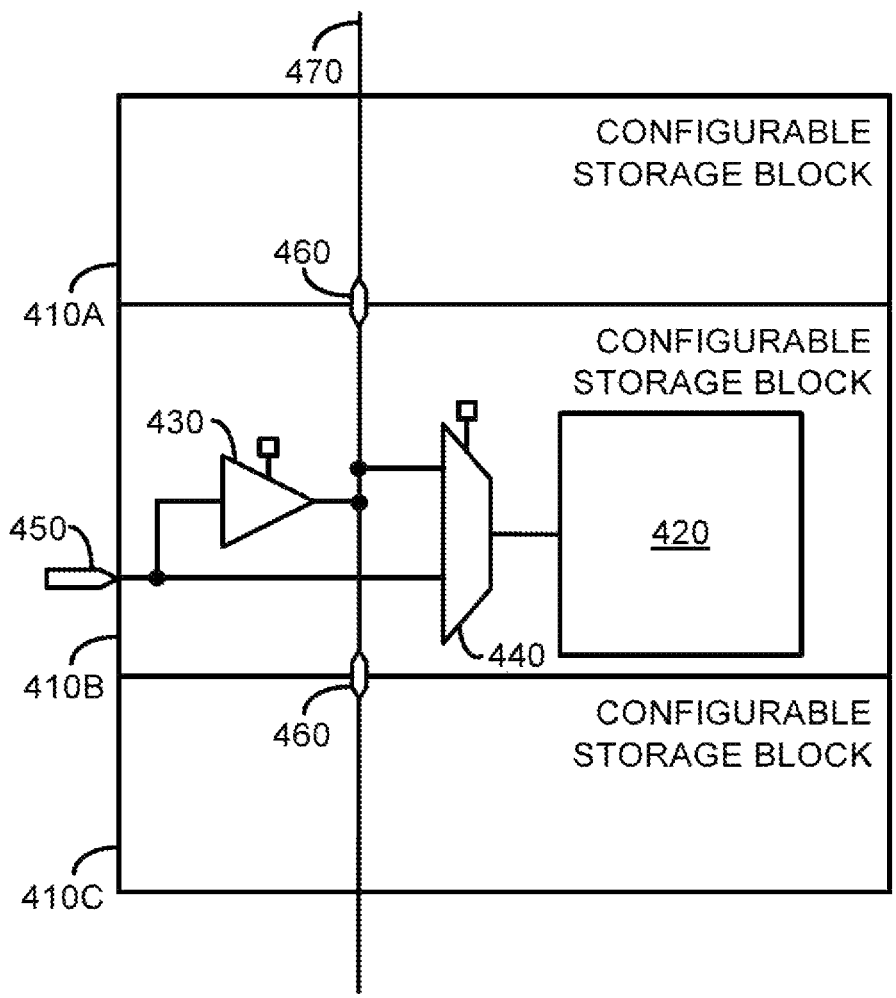
FIG. 4 is a diagram of illustrative adjacent configurable storage blocks coupled by a bi-directional internal address bus in accordance with an embodiment.

FIG. 4 is an embodiment of adjacent configurable storage blocks that are coupled by a bi-directional internal address bus. A bi-directional address bus may propagate an address signal in both directions. For example, an address signal may propagate from configurable storage block 410A down to configurable storage block 410B or up from configurable storage block 410B to configurable storage block 410A.

In the example of FIG. 4, address bus 470 traverses configurable storage blocks 410A, 410B, and 410C. Each configurable storage block such as configurable storage block 410B may have two address ports 460 through which the address bus enters and exits configurable storage block 410B, an additional address port 450, memory array 420, tri-state buffer 430, and multiplexer 440.

As an example, configurable storage block 410B may receive an address signal at address port 450. Multiplexer 440 may select the address signal received at address port 450 for performing a read or write operation on memory array 420. Tri-state buffer 430 may couple address port 450 to address bus 470, thereby routing the address signal received on address port 450 to address bus 470 from which the address signal may be propagated through address ports 460 to adjacent configurable storage blocks 410A and 410C.

In another example, tri-state buffer 430 may decouple address port 450 from address bus 470 and configurable storage block 410B may receive an address signal from configurable storage block 410A at address port 460. In this example, multiplexer 440 may select the address signal received on address bus 470 for performing a read or write operation on memory array 420.

Selectively coupling address port 450 and address bus 470 may be made statically (e.g., by programming a configuration memory at power-up operation) or dynamically (e.g., during reconfiguration of the configurable storage block at runtime). Similarly, the multiplexer 440 may make the selection between an address signal received at address port 450 and an address signal received from the address bus either statically or dynamically.

Figure 5:
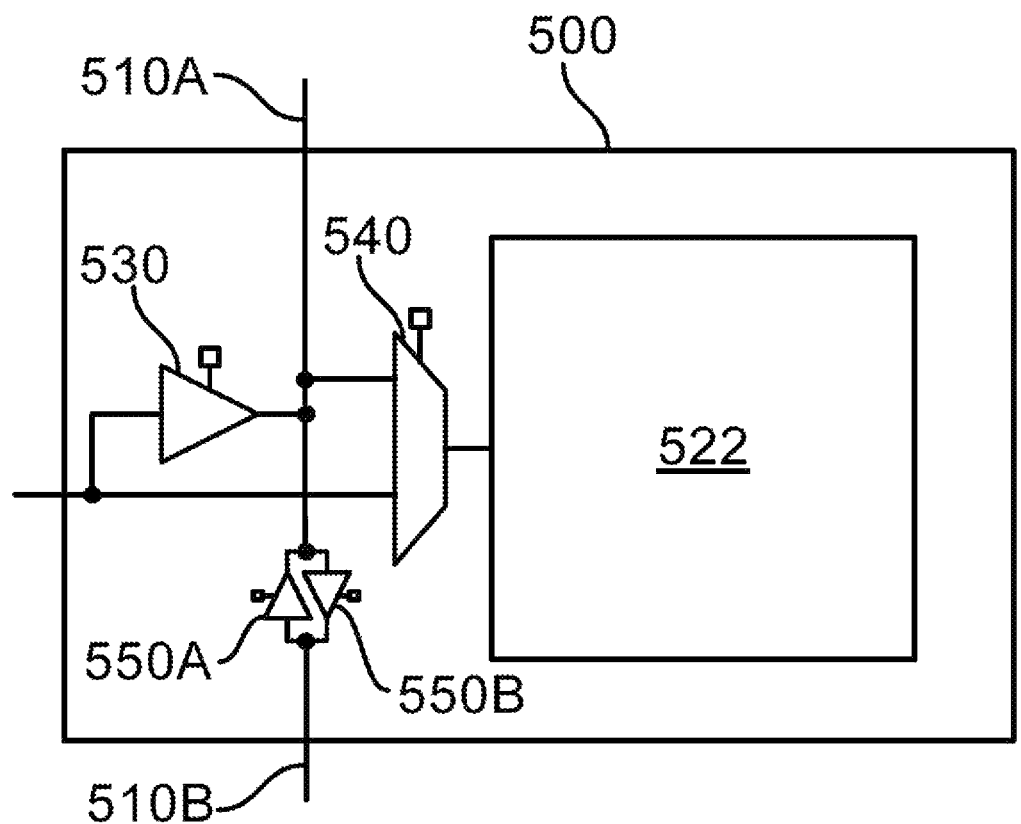
FIG. 5 is a diagram of an illustrative configurable storage block with a bi-directional internal address bus that is coupled or decoupled using tri-state buffers in accordance with an embodiment.

It may be desirable to partition an address bus into segments such that some adjacent configurable storage blocks may share one address signal while other configurable storage blocks share a different address signal. FIG. 5 shows an embodiment of a configurable storage block 500 that is traversed by a bi-directional address bus 510 which may be partitioned into segments 510A and 510B using segmentation buffers such as tri-state buffers 550A and 550B.

Besides tri-state buffers 550A and 550B, configurable storage block 500 may include memory array 522, tri-state buffer 530, and multiplexer 540. Similar to multiplexer 440 in FIG. 4, multiplexer 540 may select between an address signal received on address bus 510 and an address signal received at another address port of configurable storage block 500 for performing a read or write operation on memory array 522. Tri-state buffer 530 may enable or disable the coupling of address port of configurable storage block 500 and segment 510A of address bus 510. Tri-state buffers 550A and 550B may enable or disable the coupling of address bus 510, thereby partitioning the address bus into segments 510A and 510B.

All tri-state buffers such as tri-state buffers 530, 550A, and 550B may be controlled statically (e.g., by programming a configuration memory at power-up operation) or dynamically (e.g., during reconfiguration of the configurable storage block at runtime).

As an example, both tri-state buffers 550A and 550B may be configured to effectively decouple segments 510A and 510B such that segments 510A and 510B may carry different address signals. In another example, tri-state buffer 550B may couple 510A to 510B while tri-state buffer 550A decouples 510B from 510A. In this example, an address signal may access segment 510A (e.g., through tri-state buffer 530) and propagate through tri-state buffer 550B to adjacent configurable storage blocks that are coupled to configurable storage block 500 through segment 510B. Similarly, if tri-state buffer 550A couples 510B to 510A while tri-state buffer 550B decouples 510A from 510B, an address signal may access segment 510B and propagate through tri-state buffer 550A to segment 510A, where the address signal may be selected by multiplexer 540 to identify an address of memory array 522.

Segmentation buffers such as tri-state buffers 550A and 550B that partition an address bus into segments may be provided in every configurable storage block such as storage block 500. Alternatively, segmentation buffers may be provided only in selected configurable storage blocks whereby the distance between configurable storage blocks with segmentation buffers may be either constant or variable to provide address bus segments of constant length or variable length. The omission of segmentation buffers from selected configurable storage blocks may improve the propagation delay of the address signal over the address bus as compared to an address bus that may be segmented in every configurable storage block.

A configurable storage block such as configurable storage block 500 may be implemented in an integrated circuit that uses a redundancy scheme where spare circuitry may be switched into place to repair a defective portion of a circuit.

Integrated circuits are often arranged in rows and columns and redundancy schemes may replace entire rows or columns of the integrated circuit with spare rows or columns. For example, an integrated circuit with a row redundancy scheme (i.e., the redundancy is based on replacing defect rows with redundant rows) may implement a given design. The integrated circuit may have a defect in one of the rows, which would otherwise implement a portion of the given design. The defect may be repaired by leaving the defective row unused and shifting the implementation of the given design by one row, thereby effectively bridging the defective row.

Such a row redundancy scheme may require an address bus to receive an address signal from a configurable storage block in a neighboring row and from a configurable storage block two rows away and to select between the two received address signals. An embodiment of a unidirectional address bus with circuitry to support a row redundancy scheme is shown in FIG. 6.

Figure 6:
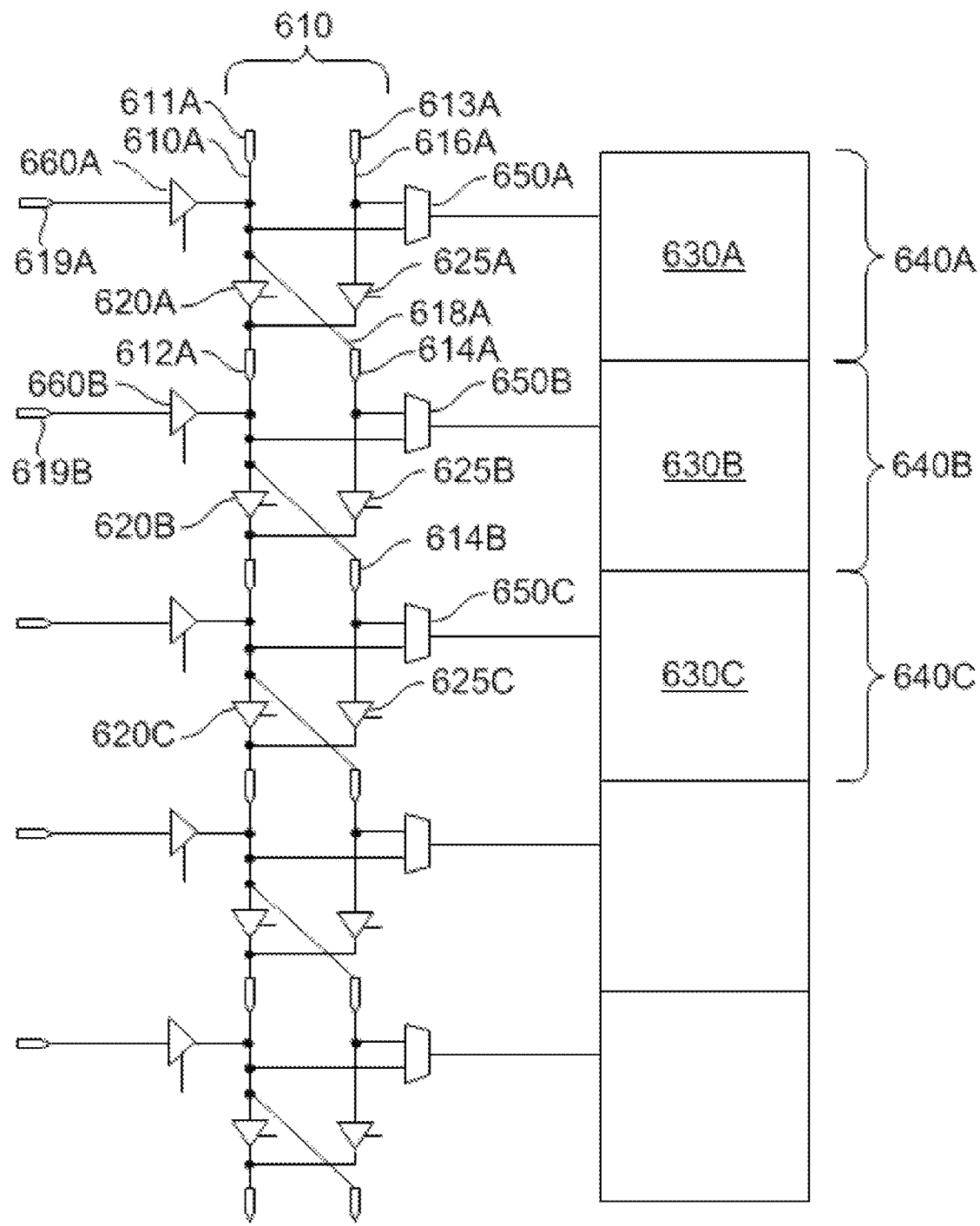
FIG. 6 is a diagram of illustrative adjacent configurable storage blocks coupled by a unidirectional address bus with redundant paths and tri-state buffers in accordance with an embodiment.

FIG. 6 shows multiple configurable storage blocks such as configurable storage blocks 640A, 640B, and 640C arranged in rows. Each configurable storage block such as configurable storage block 640A may include a memory array 630A, multiplexer 650A, tri-state buffers 660A, 620A, and 625A, address port 619A, address ports 611A and 613A on the inputs of an address bus, and address ports 612A and 614A on the outputs of the address bus.

Address bus 610 shown in FIG. 6 is unidirectional in that an address signal can only propagate downwards from a given row to rows below. For example, an address signal that enters configurable storage block 640B at address port 619B may access the address bus through tri-state buffer 660B and may propagate from there to configurable storage block 640C and below, but not to configurable storage block 640A.

As shown, each configurable storage block may receive an address signal on the address bus from the configurable storage block above through tri-state buffers 620. For example, an address signal received at address port 619A of configurable storage block 640A may access the address bus through tri-state buffer 660A. From there, the address signal may propagate through tri-state buffer 620A, address port 612A, and tri-state buffer 620B to configurable storage blocks 640B and 640C. Multiplexers 650B and 650C may select the address signal received from the address bus to identify a memory segment in memory arrays 630B and 630C, respectively.

As an example, consider that the row with configurable storage block 640B has a defect. In this example, the row with configurable storage block 640B remains unused and the implementation of a given design may be shifted down by one row, thereby effectively bridging the defective row. Thus, the memory that would have been implemented in configurable storage block 640B without a defect may now be implemented in configurable storage block 640C.

In this example, an address signal received at address port 619A of configurable storage block 640A nay access the address bus and propagate through tri-state buffer 620A to the configurable storage block 640B. The address signal may enter configurable storage block 640 through port 612A and exit configurable storage block 640 through address port 614B, because the row with configurable storage block 640B remains unused. Multiplexer 650C in configurable storage block 640C may select the address signal received at address port 614B to identify a memory segment in memory array 630C. Tri-state buffer 625C may be configured to propagate the address signal to other rows below configurable storage block 640C, while tri-state buffer 620C may prevent access to the address bus.

Alternative circuitry may be used instead of the tri-state buffers used in FIGS. 5 and 6 to partition an address bus into segments. An embodiment of a unidirectional address bus with support for a redundancy scheme that may be partitioned into segments using multiplexers is shown in FIG. 7.

Figure 7:
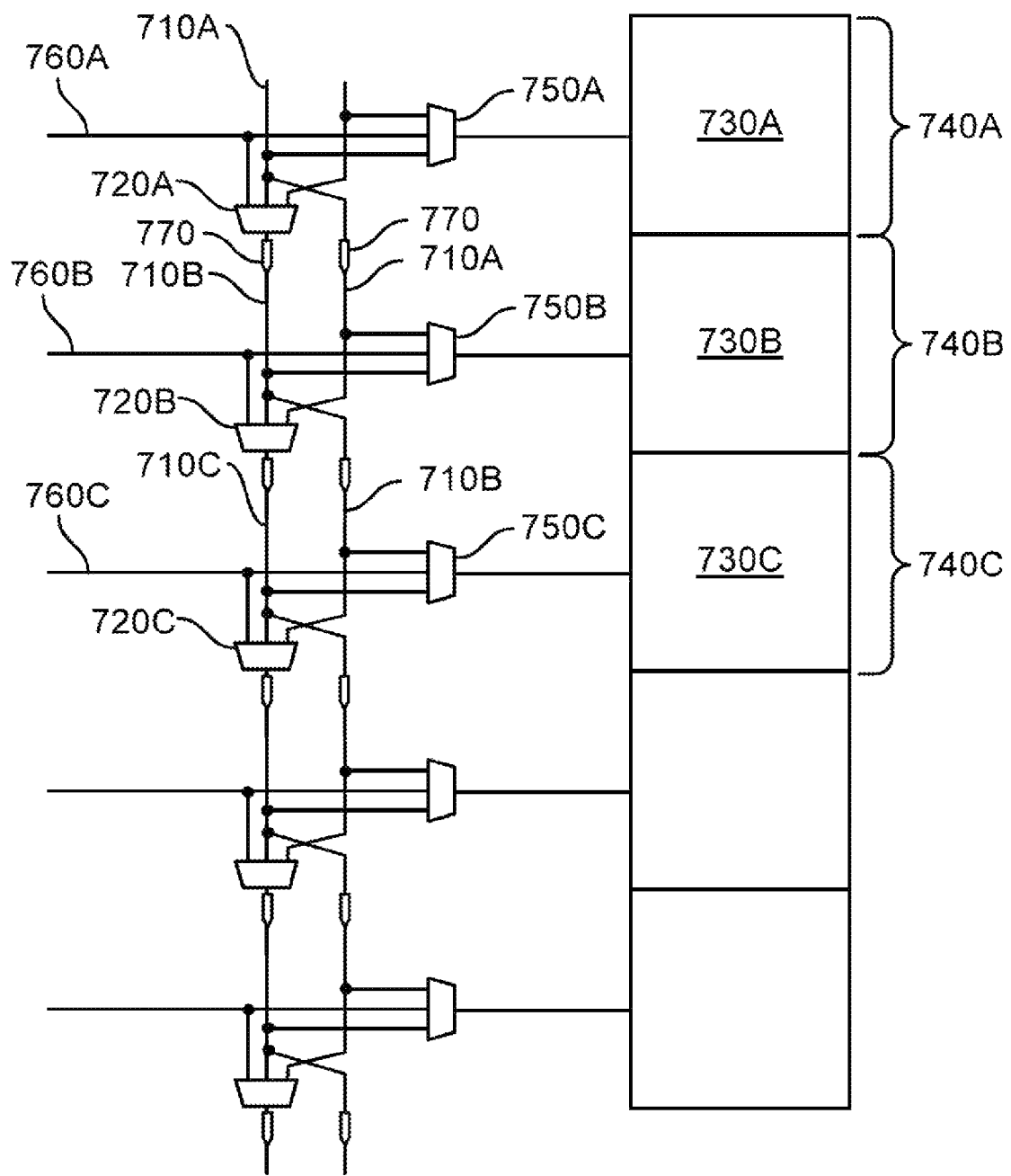
FIG. 7 is a diagram of illustrative adjacent configurable storage blocks coupled by a unidirectional address bus with redundant paths and multiplexers in accordance with an embodiment.

FIG. 7 shows multiple configurable storage blocks such as configurable storage blocks 740A, 740B, and 740C arranged in rows. Each configurable storage block such as configurable storage block 740A may include a memory array 730A, multiplexers 750A and 720A, paths 710A and 710B for the address bus, in and outgoing address ports 770 on each address bus path, and an additional address path 760A for single memory access or access to the address path.

As shown, each configurable storage block may receive an address signal on the address bus from the configurable storage block above through multiplexers 720. For example, an address signal received over address path 760A of configurable storage block 740A may access the address bus through multiplexer 720A. From there, the address signal may propagate through address port 770, address bus path 710B, multiplexer 720B, and address bus path 710C to configurable storage blocks 740B and 740C, respectively. Multiplexers 750B and 750C may select the address signal received from the address bus over address bus paths 710B and 710C to identify a memory segment in memory arrays 730B and 730C, respectively.

As an example, consider that the row with configurable storage block 740B has a defect. In this example, the row with configurable storage block 740B remains unused and the implementation of a given design may be shifted down by one row. In this example, an address signal received at address port 760A of configurable storage block 740A may access the address bus and propagate through multiplexer 720A over address bus path 710B to configurable storage block 740C. Multiplexer 750C in configurable storage block 740C may select the address signal received over address bus path 710B to identify a memory segment in memory array 730C. Multiplexer 720C may be configured to propagate the address signal received over address bus path 710B to other rows below configurable storage block 740C.

As discussed above, segmentation buffers may be provided in selected configurable storage blocks. The distance between configurable storage blocks with segmentation buffers may be either constant or variable to provide address bus segments of constant length or variable length. The omission of segmentation buffers from selected configurable storage blocks may improve the propagation delay of the address signal over the address bus as compared to an address bus that may be segmented in every configurable storage block.

Figure 8:
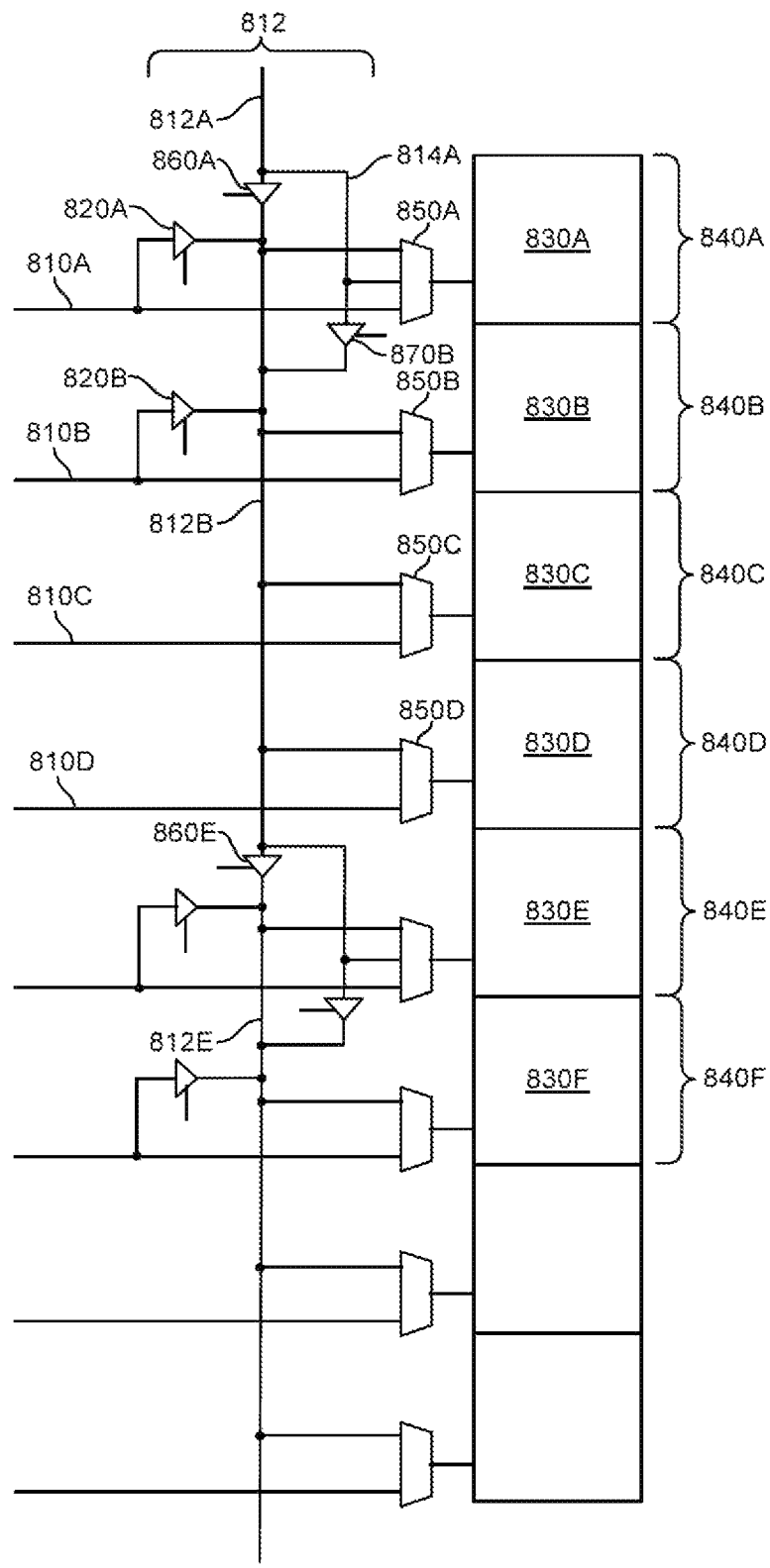
FIG. 8 is a diagram of illustrative adjacent configurable storage blocks coupled by a unidirectional address bus with redundant paths and address bus access every four configurable storage block in accordance with an embodiment.

An embodiment of adjacent configurable storage blocks coupled by a unidirectional address bus with redundant paths and address bus access every four configurable storage blocks is shown in FIG. 8. Every row shown in FIG. 8 represents one configurable storage block. Every configurable storage block 840 includes memory array 830 and multiplexer 850 (e.g., multiplexer 850A, 850B, 850C, 850D, etc.) to select between address signals received from external routing resources over path 810 or address signals received over address bus 812.

As shown, the address bus may be split into segments every four rows by tri-state buffers 860. For example tri-state buffer 860A may decouple segment 812A from segment 812B and tri-state buffer 860E may decouple segment 812B from segment 812E. Each segment 812 of the address bus may be accessed separately. For example, segment 812B may be accessed by an address signal received from external routing resources over path 810A through tri-state buffer 820A.

In order to support a redundancy scheme like the row redundancy scheme described above, additional circuitry may be provided in the configurable storage block adjacent to the configurable storage block that decouples segments of the address bus. In this example, configurable storage blocks 840B and 840F may include additional circuitry to support the redundancy scheme. For example, configurable storage block 840B may include tri-state buffers 870B and 820B.

Consider the scenario in which the row with configurable storage block 840A has a defect. In this scenario, the row with configurable storage block 840A remains unused, and segment 812B of the address bus may be accessed by an address signal received from external routing resources over path 810B through tri-state buffer 820B. In addition, tri-state buffer 870B may decouple address bus segment 812A from address bus segment 812B or couple segments 812A and 812B of the address bus together by using path 814A.

Figure 9:
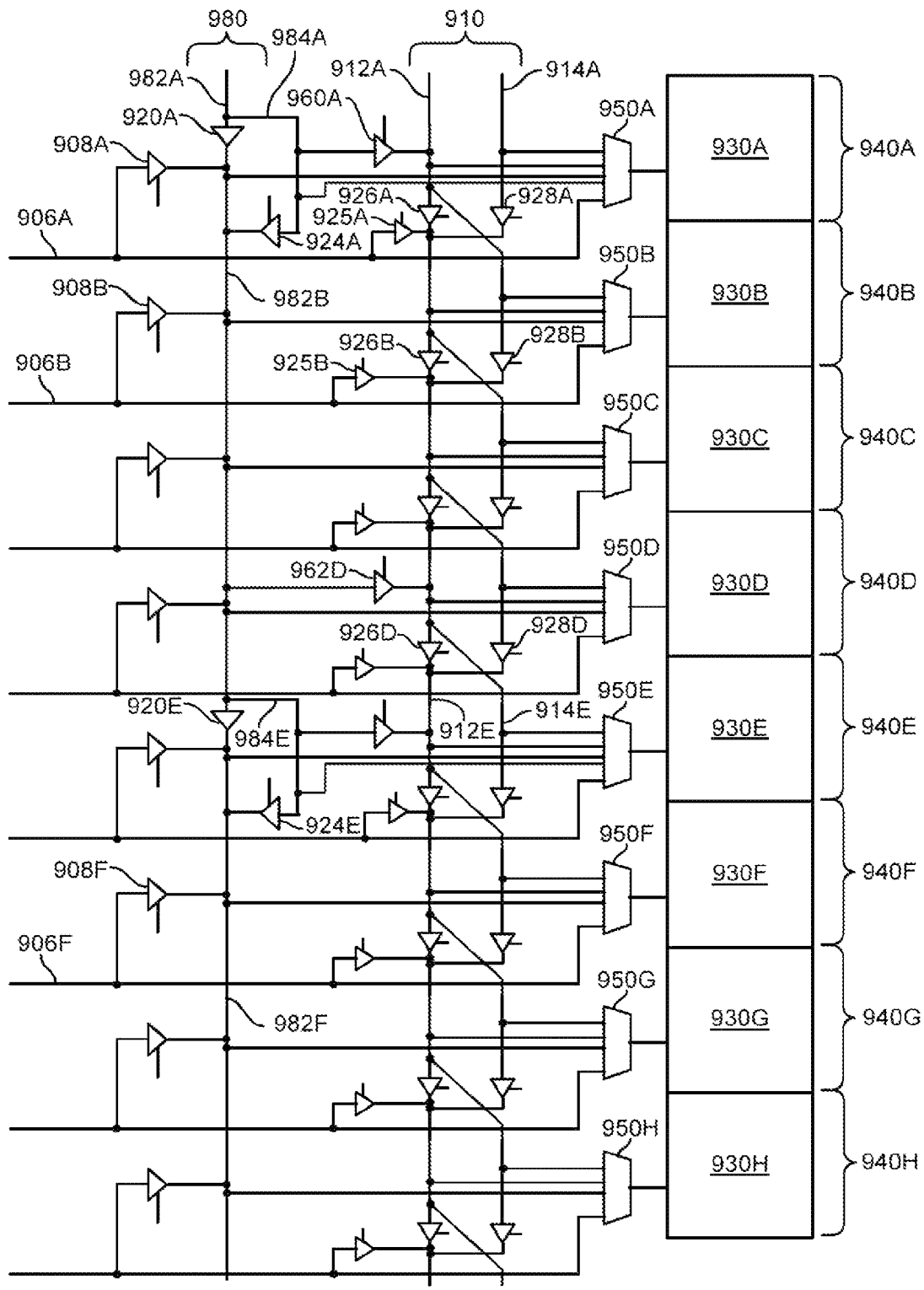
FIG. 9 is a diagram of illustrative adjacent configurable storage blocks coupled by two unidirectional address busses with redundant paths and different segment length in accordance with an embodiment.

Configurable storage blocks may be coupled by multiple address busses. FIG. 9 shows an embodiment of configurable storage blocks 940 that are coupled by two unidirectional address busses 910 and 980 which each have redundant paths and segments of different length. Address busses with longer segment lengths may provide shorter address signal delays on the address bus, while address busses with shorter segment length may provide a finer granularity for smaller memories and avoid the need to quantize to multiples of the longer segment length.

As shown, address bus 980 implements a unidirectional address bus similar to address bus 812 of FIG. 8, which may be partitioned into segments of length four. However in FIG. 8, only two out of four configurable storage blocks can access the address bus from external routing resources while every configurable storage blocks 940 in FIG. 9 may access address bus 980 over paths 906 and tri-state buffers 908.

Address bus 910 implements a unidirectional address bus similar to address bus 610 of FIG. 6. Address bus 910 may be partitioned in segments of length one using tri-state buffers 926. Tri-state buffers 928 may be used in connection with redundant paths 914 in the event of a defect in one of the rows. As shown, every configurable storage block 940 may provide access to address bus 910 over paths 906 and tri-state buffers 925.

Multiplexers 950 in configurable storage blocks 930 may select among address signals received over paths 906, from address bus 910 (e.g., path 912 or redundant path 914), or address bus 980 (e.g., path 982 or redundant path 984) to identify a memory segment of memory array 930.

Tri-state buffers 962 (or tri-state buffers 960 in case of a defect in the row above) may link address bus 980 with segment length four to address bus 910 with segment length one to provide for arbitrary address bus length. For example, consider the implementation of two memories with a first memory that may be implemented using five configurable storage blocks (e.g., configurable storage blocks 940A, 940B, 940C, 940D, and 940E) and a second memory that may be implemented using three configurable storage blocks (e.g., configurable storage blocks 940F, 940G, and 940H). The address signal for the first memory may arrive over path 906A and access address bus segment 982B via tri-state buffer 908A. Multiplexers 950A, 950B, 950C, and 950D may all select the address signal from address bus segment 982B to identify a memory segment in the respective memory arrays 930.

As shown, the address signal may be routed to memory array 930E using different paths. For example, tri-state buffer 962D may couple segment 982B of address bus 980 to address bus 910, and multiplexer 950E may select the address signal from address bus segment 914E. Alternatively, tri-state buffers 962D and 926D may couple address bus segment 982B to address bus segment 912E, and multiplexer 950E may select the address signal from address bus segment 912E. Multiplexer 950E may also select the address signal from redundant path 984E without coupling the address busses 980 and 910.

The second memory may be implemented in configurable storage blocks 940F, 940G, and 940H. The address signal may access the address bus segment 982F via path 906F and tri-state buffer 908F. Multiplexers 950F, 950G, and 950H may select the address signal from address bus segment 982F to identify a memory segment in memory arrays 930F, 930G, and 930H. Alternatively, the second memory may use three segments of address bus 910 instead.

In some scenarios, the address signal may arrive one or more clock cycles prior to the arrival of the corresponding data signal (e.g., in heavily pipelined applications), and it may be desirable to propagate the address signal to all configurable storage blocks before the execution of a write or a read operation.

Figure 10:
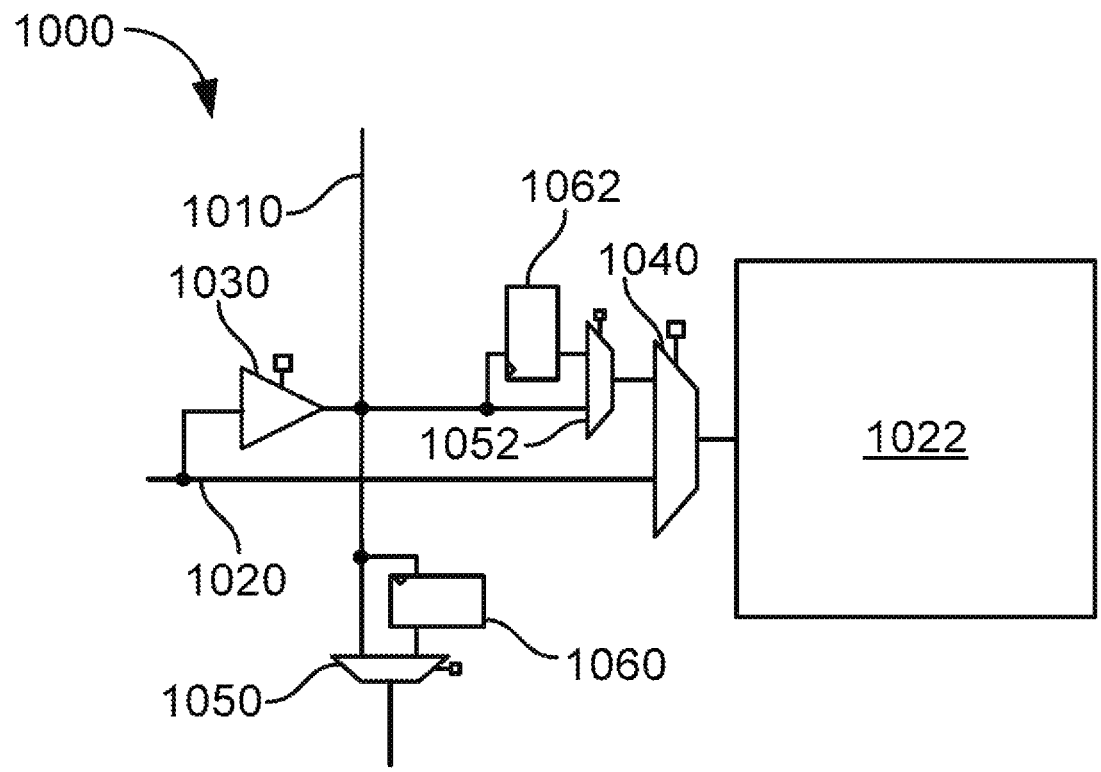
FIG. 10 is a diagram of illustrative configurable storage block with an internal unidirectional address bus that supports pipelined addressing in accordance with an embodiment.

FIG. 10 shows an embodiment of a configurable storage block with an internal unidirectional address bus that supports pipelined address signals. Configurable storage block 1000 may include memory array 1022, multiplexers 1040 and 1050, registers 1060 and 1062, and tri-state buffer 1030.

Configurable storage block 1000 may receive an address signal over path 1020 or from address bus 1010, and multiplexer 1040 may select between the received address signals. Tri-state buffer 1030 may provide access to the address bus by coupling path 1020 to address bus 1010. Address signals propagated on address bus 1010 may be stored in register 1060 and 1062 for pipelining purposes. Multiplexers 1050 and 1052 may be coupled to address bus 1010 and registers 1060 and 1062, respectively. If desired, multiplexers 1050 and 1052 may be configured to select the address signals stored in registers 1060 and 1062, thereby enabling pipelining of the address signal along the address bus. Alternatively, multiplexers 1050 and 1052 may select the address signal from address bus 1010, thereby bypassing the registers.

A circuit design system may configure a given design, and in particular the memory portion of the design such that the implementation of the design in a device (e.g., in programmable logic device 100 of FIG. 1) makes efficient use of configurable storage blocks that are coupled by an address bus.

Figure 11A:
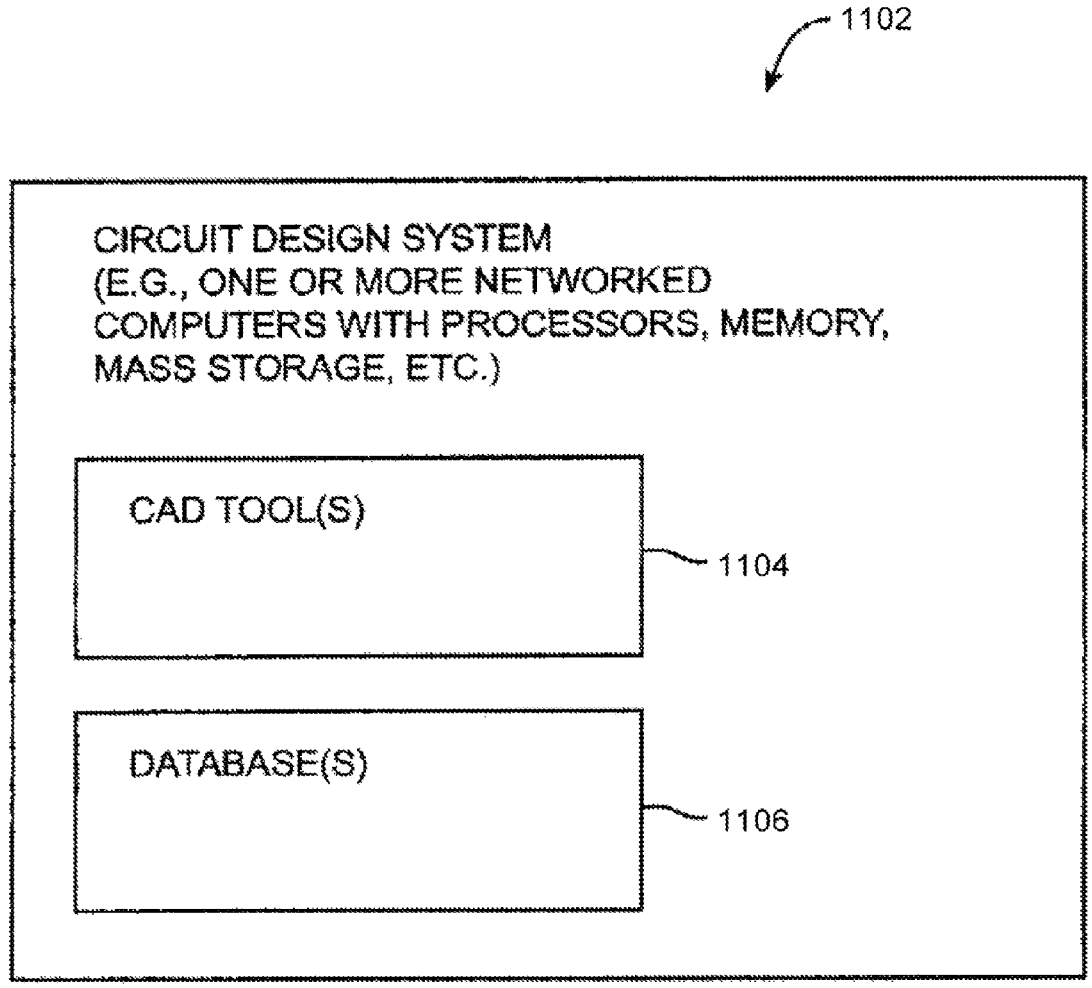
FIG. 11A is a diagram of a circuit design system that may be used to design integrated circuits in accordance with an embodiment.

An illustrative circuit design system 1102 is shown in FIG. 11A. System 1102 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 1104 and databases 1106 reside on system 1102. During operation, executable software such as the software of computer aided design tools 1104 runs on the processor(s) of system 1102. Databases 1106 are used to store data for the operation of system 1102. In general, software and data may be stored on any computer-readable medium (storage) in system 1102. Such storage may include computer memory chips, removable and fixed media such as hard disk drives, flash memory, compact discs (CDs), digital versatile discs (DVDs), blu-ray discs (BDs), other optical media, and floppy diskettes, tapes, or any other suitable memory or storage device(s). When the software of system 1102 is installed, the storage of system 1102 has instructions and data that cause the computing equipment in system 1102 to execute various methods (processes). When performing these processes, the computing equipment is configured to implement the functions of the circuit design system.

The computer aided design (CAD) tools 1104, some or all of which are sometimes referred to collectively as a CAD tool or an electronic design automation (EDA) tool, may be provided by a single vendor or by multiple vendors. Tools 1104 may be provided as one or more suites of tools (e.g., a compiler suite for performing tasks associated with implementing a circuit design in a programmable logic device) and/or as one or more separate software components (tools). Database(s) 1106 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

CAD tools 1104 may optimize the circuit design by making appropriate selections of hardware to implement different logic functions in the circuit design based on the circuit design data, constraint data, and targeted hardware integrated circuit technology. For example, a CAD tool may implement memory blocks in the circuit design using configurable storage blocks which are coupled by an address bus.

Figure 11B:
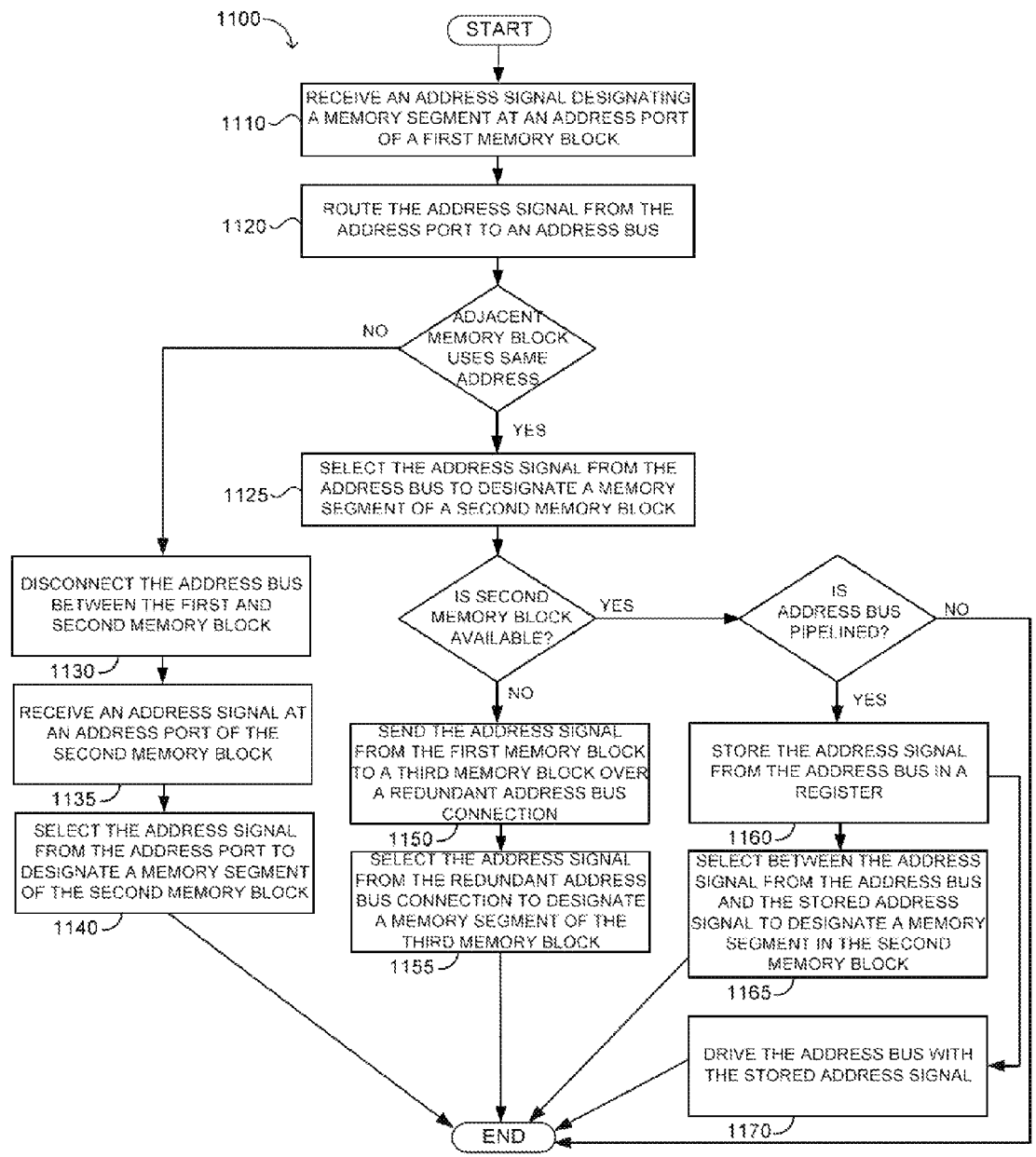
FIG. 11B is a flow chart showing illustrative steps for implementing memory blocks in a design in configurable storage blocks coupled by an address bus in accordance with an embodiment.

Flow chart 1100 in FIG. 11B is showing illustrative steps that a CAD tool (e.g., CAD tool 1104 of FIG. 11A) may perform when implementing memory blocks in adjacent configurable storage blocks which are coupled by an address bus. During step 1110, a first memory block such as configurable storage block 640A in FIG. 6 may receive an address signal designating a memory segment of a memory array at an address port such as address port 619A. During step 1120, the CAD tool may route the address signal from the address port to an address bus. For example, the CAD tool may configure tri-state buffer 660A of FIG. 6 to couple address port 619A to address bus segment 610A.

The CAD tool may determine whether an adjacent memory block such as configurable storage block 640B in FIG. 6 uses the same address signal as configurable storage block 640A. In response to determining that the adjacent memory block does not use the same address signal, the CAD tool may configure the tri-state buffers 620A and 625A to decouple the address bus between the two configurable storage blocks during step 1130. Configurable storage block 640B may receive the different address signal at port 619B during step 1135, and couple address port 619B to multiplexer 650B using tri-state buffer 660B. During step 1140, the CAD tool may configure the multiplexer 650B to select the address signal received from address port 619B to designate a memory segment of the second memory block (e.g., a memory segment of memory array 630B).

In response to determining that two adjacent memory blocks such as configurable storage blocks 640A and 640B use the same address, the CAD tool may configure a selector circuit such as multiplexer 650B to select the address signal received from the address bus (e.g., by coupling address bus segments using tri-state buffer 620A) to designate a memory segment of the second memory block (e.g., a segment in memory array 630B of configurable storage block 640B) during step 1125.

The CAD tool may determine whether the second memory block (e.g., configurable storage block 64OB) is available. As an example, configurable storage block 640B may not be available because of a defect in the row with configurable storage block 640B. In response to determining that the second memory block is not available, the CAD tool may send the address signal from the first memory block to a third memory block over a redundant bus connection during step 1150. For example, tri-state buffer 620A may couple address bus segment 610A through address ports 612A and 614B to multiplexer 650C. During step 1155, the CAD tool may configure a selector such as multiplexer 650C to select the address signal received over the redundant address bus connection (e.g., through address port 614B) to designate a memory segment of the third memory block (e.g., a segment in memory array 630C of configurable storage block 640C).

In response to determining that the second memory block is available, the CAD tool may determine whether the address bus is pipelined. In response to determining that the address bus is pipelined, the CAD tool may store the address signal from the address bus in a register (e.g., registers 1062 and 1060 of FIG. 10) during step 1160. During step 1165, the CAD tool may configure a selector such as multiplexer 1052 to select between the address signal from the address bus (e.g., address bus 1010) and the stored address signal (e.g., the address signal stored in register 1062) to identify a memory segment in the second memory block (e.g., a segment in memory array 630B of configurable storage block 640B). During step 1170, the address bus may be accessed by the stored address signal (e.g., by using multiplexer 1050 to select the address signal stored in register 1060).

It will be recognized by one skilled in the art, that the present exemplary embodiments may be practiced without some or all of these specific details. In other instances, well-known operations have not been described in detail in order not to unnecessarily obscure the present embodiments.

For example, unidirectional address busses may couple configurable storage blocks arranged in a column in an upward or downward direction or any combination thereof. Configurable storage blocks that are arranged in a row may be coupled by unidirectional address busses from left to right or from right to left or a combination of both. Configurable storage blocks may be coupled by address busses in any direction. For example, configurable storage blocks may be coupled by diagonally arranged unidirectional busses.

Configurable storage blocks may be coupled by multi-directional address busses such as bi-directional address busses or four-directional address busses (e.g., up, down, left, right) in any arbitrary direction. Configurable storage blocks may be coupled by a combination of unidirectional and multi-directional busses.

Configurable storage blocks may be coupled by multiple address busses (e.g., in single-port or multi-port applications). These multiple address busses may have the same or different directions. Multiple address busses may have segments of the same length or of different lengths within the same address bus (e.g., one address bus may have segments of length one, two, and four distributed along the address bus) and between address busses (e.g., a first address bus may have segments of length four and a second address bus may have segments of length one or a first address bus may have segments of length four and 16 and a second address bus may have segments of length one).

The different segments of an address bus may be coupled in different ways. For example, the segments of an address bus may be coupled using tri-state buffers, using selectors such as multiplexers, other switching circuitry, or any combination thereof.

Address bus segments may be assembled statically or dynamically. Any switch that couples address bus segments may be activated only once (e.g., by programming a configuration bit during power-up operation). Switches may also be activated more than once. For example, switches may be configured dynamically. For example, switches may be re-programmed to couple previously decoupled address bus segments or to decouple previously coupled address bus signals.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using high-speed serial interface circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   a first storage circuit with first and second address ports, wherein the first storage circuit receives an address signal at the first address port and routes the received address signal to the second address port;
   a second storage circuit with a third address port coupled to the second address port, wherein the second storage circuit is separate from the first storage circuit, wherein the second storage circuit receives the address signal from the second address port at the third address port, and wherein the address signal identifies a memory segment of the second storage circuit.

2. The integrated circuit of claim 1, wherein the first storage circuit further comprises:
   a tri-state buffer coupled between the first and second address ports, wherein the tri-state buffer selectively couples the first address port to the second address port.

3. The integrated circuit of claim 1, wherein the second storage circuit further comprises:
   a fourth address port that receives an additional address signal; and
   a multiplexer that receives the address signal from the third address port and the additional address signal from the fourth address port, and wherein the multiplexer selects between the received address signals.

4. The integrated circuit of claim 3, wherein the second storage circuit further comprises:
   a tri-state buffer coupled between the third address port and a fifth address port of the second storage circuit, wherein the tri-state buffer selectively couples the third address port to the fifth address port.

5. The integrated circuit of claim 1, further comprising:
   a tri-state buffer coupled between the second address port and the third address port, wherein the tri-state buffer couples the second address port to the third address port based on a control signal.

6. The integrated circuit of claim 5, further comprising:
   an additional tri-state buffer coupled between the third address port and the second address port, wherein the tri-state buffer couples the third address port to the second address port based on the control signal.

7. The integrated circuit of claim 5, wherein the second storage circuit has a fourth address port coupled to the third address port, further comprising:
   a third storage circuit with a fifth address port coupled to the fourth address port, wherein the third storage circuit receives the address signal at the fifth address port from the fourth address port, and wherein the address signal identifies a memory segment of the third storage circuit.

8. The integrated circuit of claim 7, further comprising:
   an additional tri-state buffer coupled between the fourth address port and the fifth address port, wherein the tri-state buffer couples the fourth address port to the fifth address port based on the control signal.

9. The integrated circuit of claim 8, further comprising:
   a path between the second address port and the fifth address port; and
   a second additional tri-state buffer in the path, wherein the second additional tri-state buffer couples the second address port to the fifth address port based on an additional control signal.

10. An integrated circuit comprising:
    a plurality of storage circuits each having a respective address port and first and second bus ports;
    an address bus traversing at least two storage circuits of the plurality of storage circuits, wherein the address bus enters each of the traversed storage circuits at the first bus port of that storage circuit and exits each of the traversed storage circuit at the second bus port of that storage circuit; and
    a multiplexer coupled to the first bus port and the address port of a given storage circuit of the plurality of storage circuits, wherein the multiplexer receives a first address signal from the address port and a second address signal from the first bus port and selects from the received address signals, and wherein the selected address signal identifies a memory segment of the first storage circuit.

11. The integrated circuit of claim 10, wherein the given storage circuit further comprises:
    a tri-state buffer coupled between the address port and the second bus port, wherein the tri-state buffer selectively disconnects the address port from the second bus port.

12. The integrated circuit of claim 10, wherein the given storage circuit further comprises:
    an additional multiplexer with inputs and an output, wherein the inputs are coupled to the first bus port and the address port, wherein the output is coupled to the second bus port, wherein the additional multiplexer receives a first address signal from the address port and a second address signal from the first bus port and selects a received address signal.

13. The integrated circuit of claim 10, wherein the given storage circuit further comprises:
a register coupled to the first bus port;
an additional multiplexer with inputs and an output, wherein the inputs are coupled to the first bus port and the register, wherein the output is coupled to the multiplexer, and wherein the additional multiplexer receives a first address signal from the first bus port and a second address signal from the register and selects a received address signal.

14. The integrated circuit of claim 13, wherein the given storage circuit further comprises:
an additional register coupled to the first bus port;
a second additional multiplexer with inputs and an output, wherein the inputs of the second additional multiplexer are coupled to the first bus port and the additional register, wherein the output of the second additional multiplexer is coupled to the second bus port, and wherein the second additional multiplexer receives the first address signal from the first bus port and a third address signal from the additional register and selects a received address signal.

15. The integrated circuit of claim 10, wherein the given storage circuit further comprises:
a tri-state buffer coupled between the first and second bus ports, wherein the tri-state buffer disconnects the first bus port from the second bus port based on a control signal.

16. The integrated circuit of claim 15, wherein the address bus further comprises:
a redundant address bus path that enters a storage circuit of the traversed storage circuits at a third bus port and exits that storage circuit at the second bus port, wherein the second bus port of that storage circuit is coupled to the first bus port of a subsequent storage circuit; and
an additional tri-state buffer in that storage circuit coupled between the third bus port of that storage circuit and the second bus ports of that storage circuit, wherein the additional tri-state buffer disconnects the third bus port of that storage circuit from the second bus port of that storage circuit based on the control signal.

17. The integrated circuit of claim 16, wherein the address bus further comprises:
an additional redundant address bus path that enters that storage circuit at the first bus port and exits that storage circuit at a fourth bus port, wherein the fourth bus port of that storage circuit is coupled to the third bus port of the subsequent storage circuit.

18. The integrated circuit of claim 10 further comprising:
an additional address bus traversing at least two storage circuits of the plurality of storage circuits, wherein the address bus enters each of the traversed storage circuits on a third bus port and exits each of the traversed storage circuits on a fourth bus port.

19. The integrated circuit of claim 18 further comprising:
a tri-state buffer coupled between the additional address bus and the address bus, wherein the tri-state buffer disconnects the additional address bus from the address bus based on a control signal.

20. A method for operating an integrated circuit that includes first and second memory blocks, the method comprising:
with the first memory block, receiving an address signal, wherein the address signal designates a memory segment in a first memory array of the first memory block;
with an address bus, routing the address signal from the address port of the first memory block to the second memory block; and
with a multiplexer of the second memory block coupled to the address bus and an address port of the second memory block, selecting an address signal to designate a memory segment in a second memory array of the second memory block that is different than the first memory array.

21. The method defined in claim 20 further comprising:
with a tri-state buffer, disconnecting the address bus between the first and second memory blocks;
receiving an additional address signal at the address port of the second memory block; and
with the multiplexer of the second memory block coupled to the address bus and the address port of the second memory block, selecting the additional address signal received at the address port to designate another memory segment of the second memory block.

22. The method defined in claim 20, wherein the integrated circuit comprises a third memory block coupled to the second memory block by the address bus, the method further comprising:
routing the address signal from the first memory block to the third memory block over a redundant address bus path, wherein the redundant address bus path bypasses the second memory block;
with a multiplexer of the third memory block coupled to the address bus, the redundant address bus path, and an address port of the third memory block, selecting the address signal from the redundant address bus path to designate a memory segment of the third memory block.

23. The method defined in claim 20 further comprising:
with a register in the second memory block coupled to the address bus, storing the address signal received from the address bus.

24. The method defined in claim 23, wherein the multiplexer has an additional input coupled to the register, the method further comprising:
with the multiplexer in the second memory block, selecting the stored address signal from the register to designate a memory segment of the second memory block.

25. The method defined in claim 23 further comprising:
with an additional multiplexer in the second memory block coupled to the register, receiving the stored address signal from the register and the address signal from the address bus;
with the additional multiplexer in the second memory block, selecting an address signal among the received address signals; and
with the additional multiplexer in the second memory block, driving the address bus with the selected address signal.

* * * * *